(12) United States Patent
Kanno et al.

(10) Patent No.: US 6,884,140 B2
(45) Date of Patent: Apr. 26, 2005

(54) ORGANIC LIGHT EMITTING DEVICE AND METHOD OF MANUFACTURING THE SAME

(75) Inventors: Hiroshi Kanno, Osaka (JP); Yoshitaka Nishio, Hirakata (JP)

(73) Assignee: Sanyo Electric Co., Ltd., Moriguchi (JP)

(*) Notice: Subject to any disclaimer, the term of this patent is extended or adjusted under 35 U.S.C. 154(b) by 207 days.

(21) Appl. No.: 10/394,225

(22) Filed: Mar. 24, 2003

(65) Prior Publication Data

US 2004/0048543 A1 Mar. 11, 2004

Related U.S. Application Data

(62) Division of application No. 09/813,302, filed on Mar. 21, 2001, now Pat. No. 6,614,177.

(30) Foreign Application Priority Data

Mar. 23, 2000 (JP) ........................................ 2000-081898

(51) Int. Cl.[7] .......................... H05B 33/10; H05B 33/00
(52) U.S. Cl. ........................... 445/24; 445/25; 313/500; 313/504; 313/505
(58) Field of Search .................... 445/24, 25; 313/500, 313/503, 504, 505; 428/690

(56) References Cited

U.S. PATENT DOCUMENTS 5,037,709 A * 8/1991 Tomomura et al. ......... 428/690
5,587,589 A * 12/1996 So et al. ...................... 257/88
5,949,188 A * 9/1999 Leising et al. .............. 313/500
6,297,589 B1 * 10/2001 Miyaguchi et al. ......... 313/504

OTHER PUBLICATIONS

C. W. Tang and S. A. Van Slyke; "Organic electroluminescent diodes"; Appl. Phys. Lett. 51 (12); Sep. 21, 1987 (1987 American Institute of Physics); pp. 913–915.

* cited by examiner

Primary Examiner—Mariceli Santiago
(74) Attorney, Agent, or Firm—Armstrong, Kratz, Quintos, Hanson & Brooks, LLP (57) ABSTRACT

A plurality of lower data electrodes provided on a transparent substrate are covered with an insulating layer. A plurality of upper data electrodes are arranged on the insulating layer. An organic thin film including an organic emission layer is formed on the upper data electrodes, and a plurality of scan electrodes are formed on the organic thin film to be perpendicular to the lower data electrodes. The plurality of lower data electrodes are divided into a plurality of groups. A plurality of upper data electrodes located above the lower data electrodes of each group are connected to the lower data electrodes of each group through openings of the insulating layer. The width of the scan electrodes is set to cover upper portions of the plurality of upper data electrodes arranged on the lower data electrodes of each group.

9 Claims, 8 Drawing Sheets

ORGANIC LIGHT EMITTING DEVICE AND METHOD OF MANUFACTURING THE SAME

This application is a division of application Ser. No. 09/813,302 filed Mar. 21, 2001, now U.S. Pat. No. 6,614,177, issued Sep. 2, 2003.

BACKGROUND OF THE INVENTION

1. Field of the Invention

The present invention relates to an organic light emitting device formed by organic light emitting elements such as organic electroluminescence elements having emission layers

2. Description of the Prior Art

In recent years, an organic electroluminescence element (hereinafter referred to as an organic EL element) having excellent characteristics such as a wide viewing angle, high-speed responsibility, low power consumption and the like is energetically studied. The basic structure of the organic EL element is obtained by forming an organic thin film containing a luminescent material between a transparent electrode (hole injection electrode) of ITO (indium-tin oxide) or the like and a cathode (electron injection electrode) of a material having a small work function. This organic EL element emits light due to recombination of holes and electrons, injected from the transparent electrode and the cathode respectively, in the organic thin film containing the luminescent material (refer to C. W. Tang and S. A. Van Slyke, Applied Physics Letters, Vol. 51, No. 12, pp. 913 to 915, 1987).

In an organic light emitting device employing such organic EL elements, a plurality of data electrodes (hole injection electrodes) of transparent conductive films are arranged on a glass substrate in the form of stripes, and a hole transport layer, an emission layer and an electron transport layer are stacked on the data electrodes, while a plurality of scan electrodes are arranged on the electron transport layer to be perpendicular to the data electrodes. Thus, organic EL elements are formed on the intersections between the plurality of data electrodes and the plurality of scan electrodes, for forming a dot matrix of the plurality of organic EL elements.

Methods of driving such an organic light emitting device formed by a dot matrix of a plurality of organic EL elements can be roughly classified into two systems, i.e., a passive matrix driving system and an active matrix driving system. In the passive matrix driving system, organic EL elements arranged on intersections between a plurality of scan electrodes and a plurality of data electrodes are driven in a time-sharing manner. In the active matrix driving system, organic EL elements are provided on intersections between a plurality of scan electrodes and a plurality of data electrodes through switching elements, to be selectively driven by the switching elements.

Figure 7:
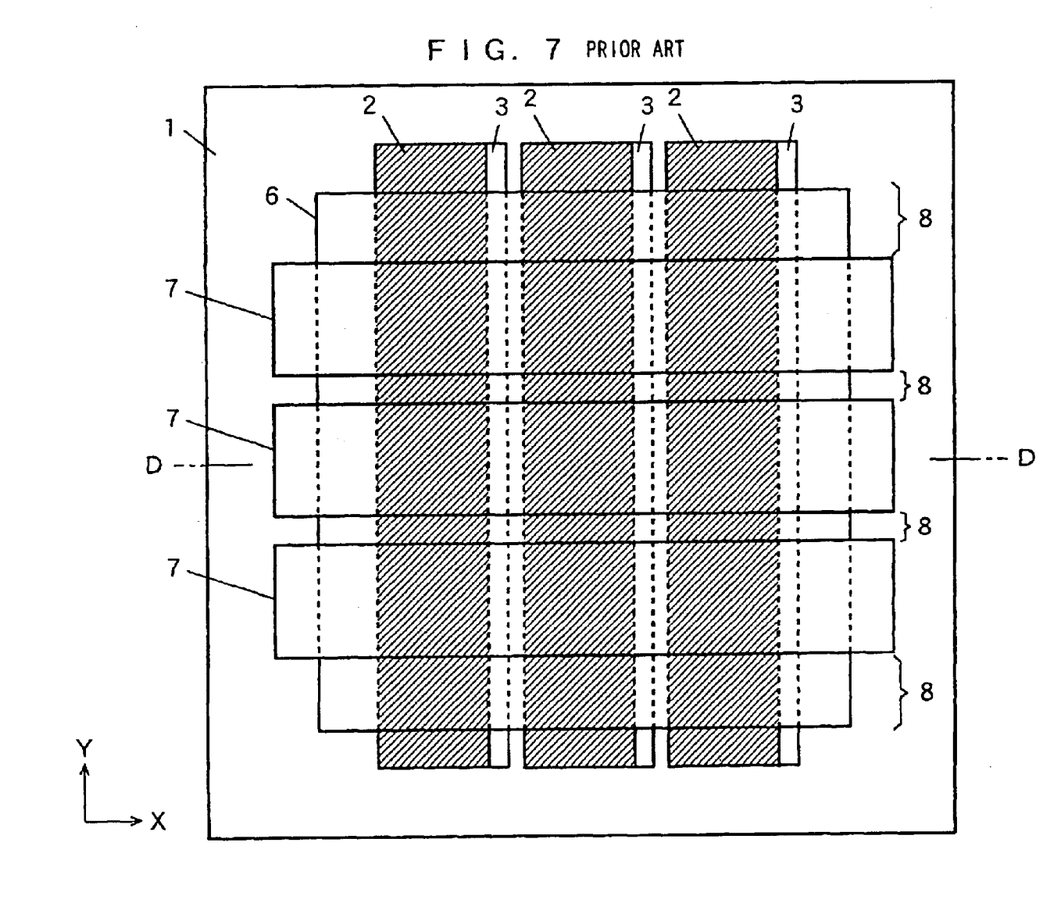
FIG. 7 is a schematic plan view showing a conventional organic light emitting device of a passive matrix driving system employing organic EL elements.
Figure 8:
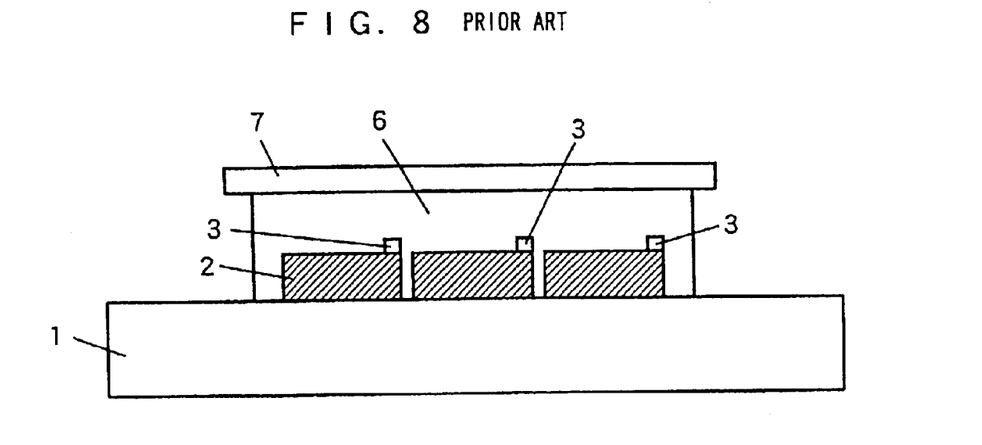
FIG. 8 is a sectional view of the organic light emitting device taken along the line D—D in FIG. 7.

FIG. 7 is a schematic plan view showing a conventional organic light emitting device of the passive matrix driving system employing organic EL elements. FIG. 8 is a sectional view of the organic light emitting device taken along the line D—D in FIG. 7.

As shown in FIGS. 7 and 8, a plurality of striped data electrodes 2 vertically extending along arrow Y are arranged on a transparent substrate 1 of glass. Each of FIGS. 7 and 8 illustrates only three data electrodes 2. The data electrodes 2 are formed by transparent conductive films of ITO (indium-tin oxide) or the like. Such data electrodes 2 have high electric resistance, and hence vertically extending bus lines 3 are formed on partial regions of the data electrodes 2 or adjacently in contact with the data electrodes 2, in order to ensure conductivity. The bus lines 3 are formed by low-resistance metal films of Cr/Mo/Cr or the like.

An organic thin film 6 including a hole transport layer, an emission layer and an electron transport layer is formed on the data electrodes 2. A plurality of striped scan electrodes 7 horizontally extending along arrow X are arranged on the organic thin film 6 to be perpendicular to the data electrodes 2. Organic EL elements are formed on intersections where the data electrodes 2 and the scan electrodes 7 oppositely intersect with each other. Each organic EL element forms a single pixel. Barrier layers 8 of a photoresist material are provided between the plurality of scan electrodes 7. Thus, the plurality of scan electrodes 7 are isolated from each other.

The aforementioned organic light emitting device of the passive matrix driving system can advantageously be more readily manufactured at a lower cost as compared with an organic light emitting device of the active matrix driving system having a plurality of switching elements arranged on a substrate.

In order to drive the organic light emitting device of the passive matrix driving system, a voltage is successively applied to the plurality of scan electrodes 7 in one frame. Thus, a row of pixels located under each scan electrode 7 are selected so that each pixel enters a luminous state or a non-luminous state in response to a voltage applied to the data electrodes 2.

The organic light emitting device of the passive matrix driving system is desired to be improved in luminance and definition and increased in size, to be capable of displaying continuous motion pictures.

In order to improve the definition and increase the size of the organic light emitting device, the number of the scan electrodes 7 must be increased. When the number of the scan electrodes 7 is increased, however, the number of the rows of the pixels successively selected in one frame is so increased that the selection time for each pixel is reduced to reduce the duty ratio. The term "duty ratio" stands for the ratio of the time when each pixel is selected in one frame. When the duty ratio is reduced, luminance visually recognized by human eyes is reduced.

In order to ensure sufficient luminance in the organic light emitting device, the selected pixels must emit light in high luminance. Therefore, the organic EL element forming each pixel must be driven at a high voltage. In this case, a high electric field is applied to each organic EL element, to increase the temperature. When an organic EL element is left under a high electric field and a high temperature in general, deterioration of the organic material rapidly progresses to remarkably reduce reliability of the element. Therefore, it is difficult to improve the luminance and definition and increase the size of the organic light emitting device while ensuring the reliability.

As hereinabove described, a technique of providing the barrier layers 8 between the scan electrodes 7 by patterning a photoresist material is employed for isolating the plurality of scan electrodes 7 from each other. However, the aperture ratio (the ratio of the pixel region to a display region) of the pixels is remarkably reduced due to the barrier layers 8 inserted between the scan electrodes 7. In order to compensate for such reduction of the aperture ratio of the pixels, each pixel must emit light in high luminance. Thus, the reliability of the element is remarkably reduced as described above.

When the barrier layers 8 of a photoresist material are formed between the plurality of scan electrodes 7, the photoresist material must be patterned into an optimum shape. However, the photoresist material is generally patterned through a wet process, and hence it is difficult to pattern the photoresist material into a precise shape due to residues etc. resulting from the patterning. Consequently, the non-defective ratio of the organic light emitting device is reduced.

Further, the barrier layers 8 of a photoresist material contain a larger amount of moisture as compared with the data electrodes 2, the organic thin film 6 and the scan electrodes 7. This moisture may gradually permeate into the scan electrodes 7, to oxidize a metal. Thus, current injection efficiency is extremely reduced, to result in dark spots. Or, the moisture permeating from the barrier layers 8 may inactivate the interface between the organic thin film 6 and the scan electrodes 7. Also in this case, light emitting potions are gradually contracted, to result in dark spots. Such permeation of the moisture into the interface between the organic thin film 6 and the scan electrodes 7 progresses from both ends of the scan electrodes 7 isolated from each other by the barrier layers 8. Thus, the number of portions invaded by the moisture is increased as the number of the scan electrodes 7 is increased, to accelerate deterioration of element characteristics.

SUMMARY OF THE INVENTION

An object of the present invention is to provide an organic light emitting device having high reliability, which can be improved in luminance and definition and increased size, and a method of manufacturing the same.

An organic light emitting device according to an aspect of the present invention comprises a substrate, a plurality of first electrode layers formed on the substrate along a first direction, an insulating layer formed to cover upper portions of the plurality of first electrode layers and clearances between the plurality of first electrode layers and having a plurality of openings on the plurality of first electrode layers, a plurality of second electrode layers arranged on the insulating layer in the form of a matrix to be electrically connected to the plurality of fist electrode layers through the plurality of openings, an organic thin film, formed on the plurality of second electrode layers, including an emission layer, and a plurality of third electrode layers formed on the organic thin film along a second direction intersecting with the first direction, wherein the plurality of first electrode layers are divided into units each including m (m: at least two) adjacent first electrode layers, a plurality of second electrode layers located above the m first electrode layers of each unit are divided into units each including m second electrode layers arranged to deviate in the first direction and adjacent to each other, the m second electrode layers of each unit are connected to the m first electrode layers of the corresponding unit through the openings of the insulating layer respectively, and each third electrode layer has a width covering a portion above the m second electrode layers of each unit in the first direction.

In this organic light emitting device, the second electrode layers located on the intersections between the first electrode layers and the third electrode layers, the organic thin film including the emission layer and the third electrode layers form organic light emitting elements. The organic light emitting elements form pixels.

The m second electrode layers of each unit are arranged to deviate in the first direction and each third electrode layer has a width covering the portion above the m second electrode layers of each unit, whereby the pixels are arranged under each third electrode layer in a plurality of rows. Therefore, a plurality of rows of elements are simultaneously selected by each third electrode layer. Thus, the number of the third electrode layers can be reduced.

If the number of the third electrode layers is reduced, the ratio of the time for selecting each pixel in one frame can be increased when the plurality of third electrode layers are successively driven in one frame. Consequently, luminance can be improved without driving the organic light emitting element forming each pixel at a high voltage. Therefore, the organic material is prevented from deterioration caused by application of a high electric field and heat generation, and reliability of the organic light emitting device is improved.

When the number of the third electrode layers is reduced, further, the regions between the third electrode layers are also reduced, whereby the ratio of the pixel region to a display region can be increased. Thus, high luminance can be attained. Further, moisture is inhibited from permeating into the organic thin film from the regions between the third electrode layers, due to the reduction of the regions between the third electrode layers. Thus, the organic light emitting elements are prevented from deterioration of characteristics.

When the number of the third electrode layers is reduced, in addition, patterning accuracy for barrier layers formed between the third electrode layers is relaxed. Thus, the non-defective ratio of the organic light emitting device is improved.

On the other hand, it is also possible to increase the number of the third electrode layers thereby increasing the number of rows of the pixels while ensuring prescribed luminance. Consequently, the organic light emitting device can be improved in definition and increased in size without driving the organic light emitting element forming each element at a high voltage. Therefore, the organic material is prevented from deterioration caused by application of a high electric field and heat generation, and the reliability of the organic light emitting device is ensured.

The plurality of first electrode layers are covered with the insulating layer, whereby electric shorting hardly takes place across the first electrode layers and the third electrode layers arranged to intersect with each other. Thus, the organic light emitting device is improved in reliability.

Each of the plurality of second electrode layers may have a larger area than the openings provided in the insulating layer. In this case, the area of each pixel can be increased, whereby the organic light emitting device can be further improved in luminance and definition.

Each of the m second electrode layers of each unit may have a length covering a portion above the m first electrode layers of the corresponding unit in the second direction.

In this case, the area of each pixel is so increased that the ratio of the pixel region to the display region is increased. Thus, the organic light emitting device can be further improved in luminance and definition.

The insulating layer may be made of an oxide, a nitride, a carbide, a sulfide or a polymer film. Permeation of moisture can be sufficiently prevented particularly when the insulating layer is made of an oxide, a nitride, a carbide or a sulfide.

The organic light emitting device may further comprise a plurality of bus lines formed on the plurality of first electrode layers respectively. Thus, the first electrode layers are improved in conductivity.

An organic light emitting device according to another aspect of the present invention comprises a substrate, a plurality of first electrode layers formed on the substrate along a first direction, an insulating layer formed to cover upper portions of the plurality of first electrode layers and clearances between the plurality of first electrode layers and having a plurality of openings on the plurality of first electrode layers, a plurality of second electrode layers arranged on the insulating layer in the form of a matrix to be electrically connected to the plurality of first electrode layers through the plurality of openings, an organic thin film, formed on the plurality of second electrode layers, including an emission layer, and a plurality of third electrode layers formed on the organic thin film along a second direction intersecting with the first direction.

In this organic light emitting device, the second electrode layers located on the intersections between the first electrode layers and the third electrode layers, the organic thin film including the emission layer and the third electrode layers form organic light emitting elements. The organic light emitting elements form pixels.

In particular, the plurality of first electrode layers are covered with the insulating layer, whereby electrical shorting hardly takes place across the first electrode layers and the third electrode layers arranged to intersect with each other. Therefore, the organic light emitting device is improved in reliability.

Each of the plurality of second electrode layers may have a lager area than the openings provided in the insulating layer. In this case, the area of each pixel can be increased, whereby the organic light emitting device can be further improved in luminance and definition.

The insulating layer may be made of an oxide, a nitride, a carbide, a sulfide or a polymer film. Permeation of moisture can be sufficiently prevented particularly when the insulating layer is made of an oxide, a nitride, a carbide or a sulfide.

The organic light emitting device may further comprise a plurality of bus lines formed on the plurality of first electrode layers respectively. Thus, the first electrode layers are improved in conductivity.

A method of manufacturing an organic light emitting device according to still another aspect of the present invention comprises steps of forming a plurality of first electrode layers on a substrate along a first direction, forming an insulating layer to cover upper portions of the plurality of first electrode layers and clearances between the plurality of first electrode layers, forming a plurality of openings in the insulating layer located on the plurality of first electrode layers, forming a plurality of second electrode layers on the insulating layer in the form of a matrix to be electrically connected to the plurality of first electrode layers through the plurality of openings, forming an organic thin film including an emission layer on the plurality of second electrode layers, and forming a plurality of third electrode layers on the organic thin film along a second direction intersecting with the first direction, wherein the step of forming a plurality of second electrode layers includes a step of dividing the plurality of first electrode layers into units each including m (m: at least two) adjacent first electrode layers, dividing a plurality of second electrode layers located above the m first electrode layers of each unit into units each including m second electrode layers arranged to deviate in the first direction and adjacent to each other, and connecting the m second electrode layers of each unit to the m first electrode layers of the corresponding unit through the openings of the insulating layer respectively, and the step of forming a plurality of third electrode layers includes a step of forming each third electrode layer in a width covering a portion above the m second electrode layers of each unit in the first direction.

In the organic light emitting device manufactured by the method according to the present invention, the second electrode layers located on the intersections between the first electrode layers and the third electrode layers, the organic thin film including the emission layer and the third electrode layers form organic light emitting elements. The organic light emitting elements form pixels.

The m second electrode layers of each unit are arranged to deviate in the first direction and each third electrode layer has a width covering the portion above the m second electrode layers of each unit, whereby the pixels are arranged in a plurality of rows under each third electrode layer. Thus, a plurality of rows of pixels are simultaneously selected by each third electrode layer. Thus, the number of the third electrode layers can be reduced.

If the number of the third electrode layers is reduced, the ratio of the time for selecting each pixel in one frame can be increased when the plurality of third electrode layers are successively driven in one frame. Consequently, luminance can be improved without driving the organic light emitting element forming each pixel at a high voltage. Therefore, the organic material is prevented from deterioration caused by application of a high electric field and heat generation, and reliability of the organic light emitting device is improved.

When the number of the third electrode layers is reduced, further, the regions between the third electrode layers are also reduced, whereby the ratio of the pixel region to a display region can be increased. Thus, high luminance can be attained. Further, moisture is inhibited from permeating into the organic thin film from the regions between the third electrode layers, due to the reduction of the regions between the third electrode layers. Thus, the organic light emitting elements are prevented from deterioration of characteristics.

When the number of the third electrode layers is reduced, in addition, patterning accuracy for barrier layers formed between the third electrode layers is relaxed. Thus, the non-defective ratio of the organic light emitting device is improved.

On the other hand, it is also possible to increase the number of the third electrode layers thereby increasing the number of rows of the pixels while ensuring prescribed luminance. Consequently, the organic light emitting device can be improved in definition and increased in size without driving the organic light emitting element forming each element at a high voltage. Therefore, the organic material is prevented from deterioration caused by application of a high electric field and heat generation, and the reliability of the organic light emitting device is ensured.

The plurality of first electrode layers are covered with the insulating layer, whereby electric shorting hardly takes place across the first electrode layers and the third electrode layers arranged to intersect with each other. Thus, the organic light emitting device is improved in reliability.

Each of the plurality of second electrode layers may have a larger area than the openings provided in the insulating layer. In this case, the area of each pixel can be increased, whereby the organic light emitting device can be further improved in luminance and definition.

Each of the m second electrode layers of each unit may have a length covering a portion above the m first electrode layers of the corresponding unit in the second direction.

In this case, the area of each pixel is so increased that the ratio of the pixel region to the display region is increased. Thus, the organic light emitting device can be further improved in luminance and definition.

The insulating layer may be made of an oxide, a nitride, a carbide, a sulfide or a polymer film. Permeation of moisture can be sufficiently prevented particularly when the insulating layer is made of an oxide, a nitride, a carbide or a sulfide.

The method of manufacturing an organic light emitting device may further comprise a step of forming a plurality of bus lines on the plurality of first electrode layers respectively. Thus, the first electrode layers are improved in conductivity.

A method of manufacturing an organic light emitting device according to a further aspect of the present invention comprises steps of forming a plurality of first electrode layers on a substrate along a first direction, forming an insulating layer cover upper portions of the plurality of first electrode-layers and clearances between the plurality of first electrode layers, forming a plurality of openings in the insulating layer located on the plurality of first electrode layers, forming a plurality of second electrode layers on the insulating layer in the form of a matrix to be electrically connected to the plurality of first electrode layers through the plurality of openings, forming an organic thin film including an emission layer on the plurality of second electrode layers, and forming a plurality of third electrode layers on the organic thin film along a second direction intersecting with the first direction.

In the organic light emitting device manufactured by this method, the second electrode layers located on the intersections between the first electrode layers and the third electrode layers, the organic thin film including the emission layer and the third electrode layers form organic light emitting elements. The organic light emitting elements form pixels.

In particular, the plurality of first electrode layers are covered with the insulating layer, whereby electric shorting hardly takes place across the first electrode layers and the third electrode layers arranged to intersect with each other. Therefore, the organic light emitting device is improved in reliability.

Each of the plurality of second electrode layers may have a lager area than the openings provided in the insulating layer. In this case, the area of each pixel can be increased, whereby the organic light emitting device can be further improved in luminance and definition.

In this case, the area of each pixel is so increased that the ratio of the pixel region to the display region is increased. Thus, the organic light emitting device can be further improved in luminance and definition.

The insulating layer may be made of an oxide, a nitride, a carbide, a sulfide or a polymer film. Permeation of moisture can be sufficiently prevented particularly when the insulating layer is made of an oxide, a nitride, a carbide or a sulfide.

The method may further comprise a step of forming a plurality of bus lines on the plurality of first electrode layers respectively. Thus, the first electrode layers are improved in conductivity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
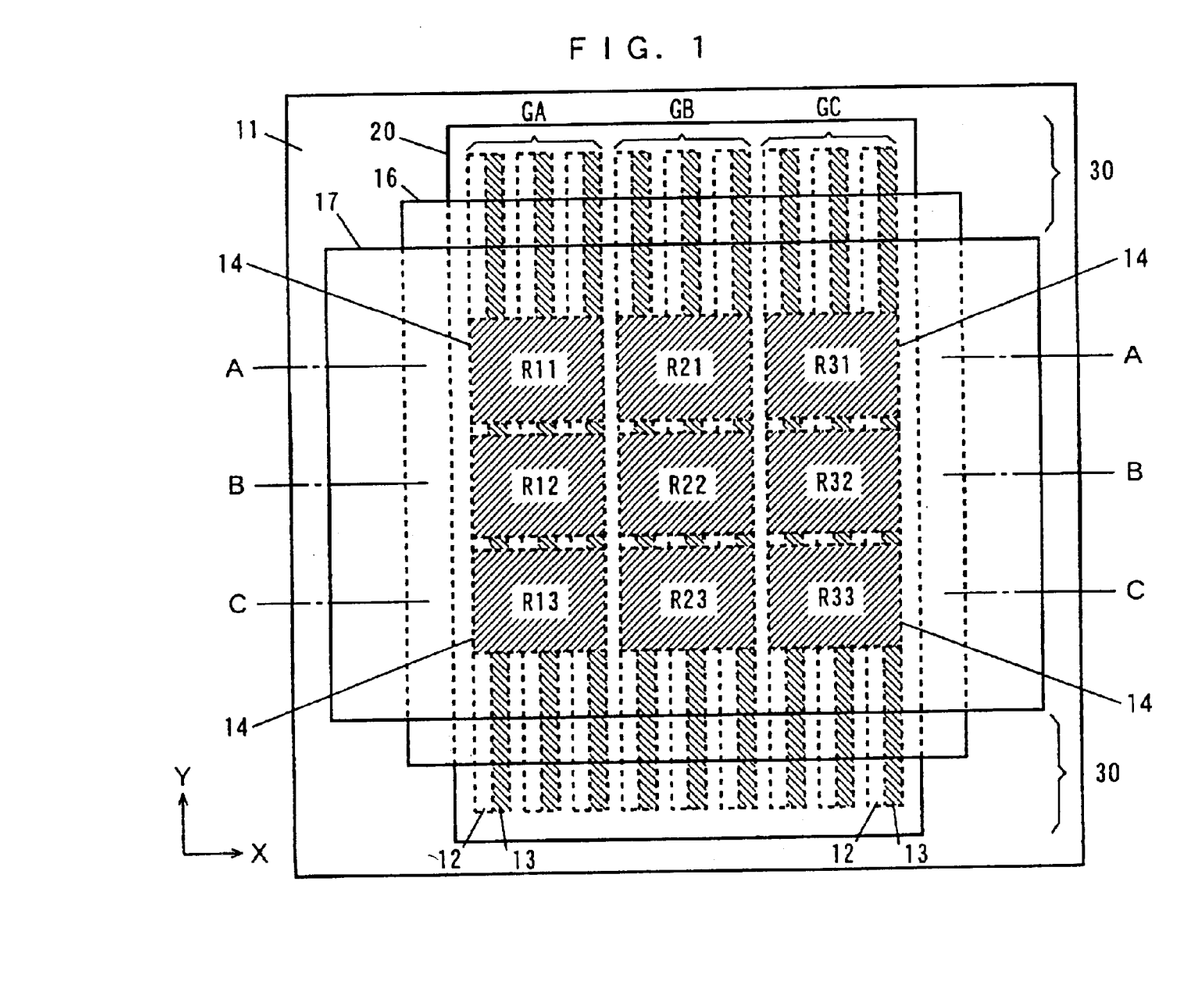
FIG. 1 is a schematic plan view of an organic light emitting device employing organic EL elements according to an embodiment of the present invention.
Figure 2A:
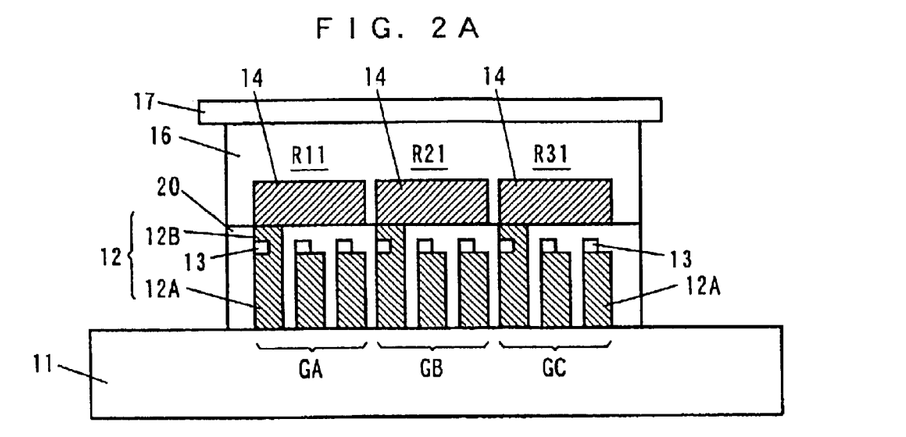
FIGS. 2A, 2B and 2C are sectional views of the organic light emitting device taken along the lines A—A, B—B and C—C in FIG. 1 respectively.
Figure 2B:
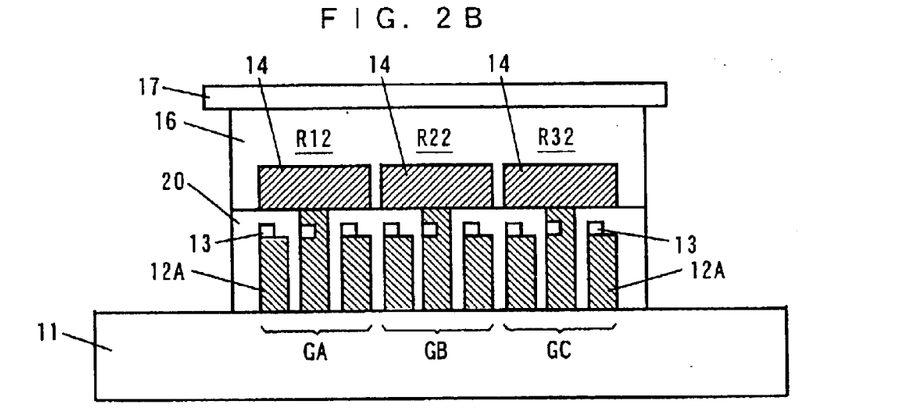
Figure 2C:
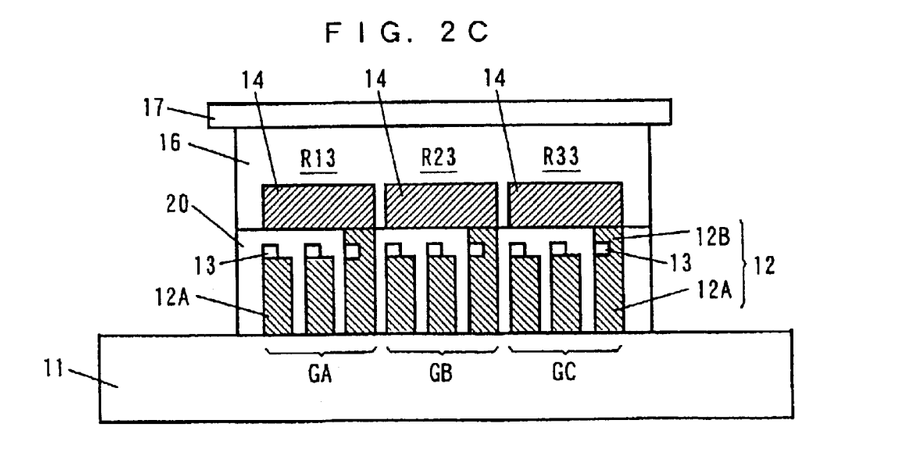

FIG. 1 is a schematic plan view of an organic light emitting device employing organic electroluminescence elements (hereinafter referred to as organic EL elements) according to an embodiment of the present invention. FIGS. 2A, 2B and 2C are sectional views of the organic light emitting device taken along the lines A—A, B—B and C—C in FIG. 1 respectively.

A plurality of lower data electrodes 12 vertically extending along arrow Y in the form of stripes are arranged on a transparent substrate 11. Each of FIGS. 1 and 2A to 2C illustrates only nine lower data electrodes 12. The transparent substrate 11 is made of glass, quartz, transparent resin or the like, and has dimensions of 80 mm by 80 mm and a thickness of about 1.1 mm. The lower data electrodes 12 are formed by transparent conductive films of ITO (indium-tin oxide) or the like. The width of the lower data electrodes 12 is about 0.3 mm, and the interval between the lower data electrodes 12 is about 0.04 mm.

A bus line 13 is formed on each lower data electrode 12, in order to ensure conductivity. The bus line 13 is formed by a low-resistance metal film of Cr/Mo/Cr or the like. The bus line 13 has a width of 0.04 mm and a thickness of about 300 nm.

The plurality of lower data electrodes 12 are divided into a plurality of groups. According to this embodiment, each group is formed by three lower data electrodes 12. Each of FIGS. 1 and 2A to 2C shows three groups GA, GB and GC.

An insulating layer 20 is formed to cover upper portions of the plurality of lower data electrodes 12 and clearances between the plurality of lower data electrodes 12. According to this embodiment, the insulating layer 20 is made of SiO$_2$, photosensitive insulating resin or the like.

As shown in FIGS. 2A, 2B and 2C, each lower data electrode 12 is formed by a lower electrode layer 12A and an upper electrode layer 12B. The upper electrode layer 12B is formed in an opening provided on a prescribed position of the insulating layer 20.

A plurality of upper data electrodes 14 are formed on the insulating layer 20 located above the three data electrodes 12 forming each group vertically at prescribed intervals. FIG. 1 shows three upper data electrodes 14 vertically arranged on each of the groups GA, GB and GC.

As shown in FIG. 2A, the lower electrode layers 12A of the leftmost lower data electrodes 12 of the groups GA, GB and GC are connected to the upper data electrodes 14 located on a first vertical end in FIG. 1 through the upper electrode layers 12B. As shown in FIG. 2B, the lower electrode layers 12A of the central lower data electrodes 12 of the groups GA, GB and GC are connected to the upper data electrodes 14 located on the vertical center in FIG. 1 through the upper electrode layers 12B. As shown in FIG. 2C, the lower electrode layers 12A of the rightmost lower data electrodes 12 of the groups GA, GB and GC are connected to the upper data electrodes 14 located on a second vertical end in FIG. 1 through the upper electrode layers 12B.

An organic thin film 16 including a hole transport layer of about 50 to 60 nm in thickness and an organic emission layer of about 30 to 40 nm in thickness is formed on the upper data electrodes 14. The organic thin film 16 may be stacked for every luminescent color, or well-known luminescent materials may be mixed and stacked with each other to form the organic thin film 16.

The material for the hole transport layer is preferably prepared from a transparent organic material having high hole mobility and an excellent film forming property. For example, a triphenylamine derivative (TPD), a hydrazone derivative, an arylamine derivative, porphyrin, phthalocyanine, copper phthalocyanine or the like can be employed as the material for the hole transport layer.

The material for the organic emission layer is preferably prepared from an organic material of a fluorescent substance having fluorescence in the visible region and exhibiting an excellent film forming property. For example, an 8-hydroxyquinoline metal complex such as tris(8-quinolinol)aluminum or bis(8-quinolinol)magnesium, an oxadiazole derivative, a perylene derivative or the like can be employed as the material for the organic emission layer. When a material having hole transportability, electron portability and luminescence is employed as the material for the organic emission layer, the organic thin film 16 can be prepared from a single type of material. An electron transport layer of an aluminum chelate complex ($Alq_3$) or the like may be provided on the organic emission layer.

A plurality of scan electrodes 17 horizontally extending along arrow X in the form of stripes are arranged on the organic thin film 16 to be perpendicular to the plurality of lower data electrodes 12. FIG. 1 shows only a single scan electrode 17. The scan electrodes 17 are made of an Mg—Ag alloy containing about 1% of In, for example. The thickness of the scan electrodes 17 is about 50 nm to 300 nm. Barrier layers 30 of photoresist or the like are provided between the scan electrodes 17.

The material for the scan electrodes 17 is not restricted to the above but can be prepared from Al, Li, Mg, In, Ag or the like.

The width of the scan electrodes 17 is so set as to cover upper portions of the upper data electrodes 14 arranged on the lower data electrodes 12 of the groups GA, GB and GC. Organic EL elements are formed on regions of the organic thin film 16 held between the upper data electrodes 14 and the scan electrodes 17. Each organic EL element forms a single pixel.

Regions of the organic thin film 16 held between the three upper data electrodes 14 of the group GA and the scan electrode 17 are referred to as pixels R11, R12 and R13 respectively. Regions of the organic thin film 16 held between the three upper data electrodes 14 of the group GB and the scan electrode 17 are referred to as pixels R21, R22 and R23 respectively. Regions of the organic thin film 16 held between the three upper data electrodes 14 of the group GC and the scan electrode 17 are referred to as pixels R31, R32 and R33 respectively.

Thus, three pixels are vertically formed by a single scan electrode 17 in each of the groups GA, GB and GC.

An exemplary method of manufacturing the organic light emitting device shown in FIGS. 1 and 2A to 2C is now described. FIGS. 3A to 3C and 4D to 4E are schematic sectional views showing steps of the method of manufacturing the organic light emitting device shown in FIGS. 1 and 2A to 2C.

Figure 3A:
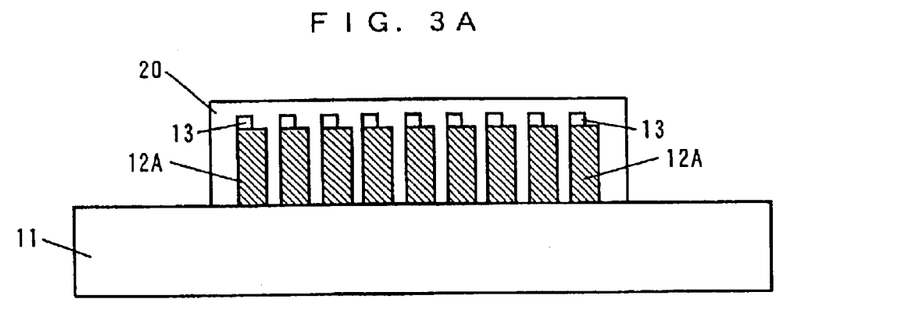
FIGS. 3A, 3B and 3C are schematic sectional views showing steps in a method of manufacturing the organic light emitting device shown in FIGS. 1 and 2A to 2C.

As shown in FIG. 3A, a transparent conductive film of ITO is formed on the transparent substrate 11 of glass having a thickness of 1.1 mm and patterned, thereby forming the plurality of lower electrode layers 12A in the form of stripes. A low-resistance metal film of Cr/Mo/Cr having a thickness of 300 nm is formed on the overall surface of the transparent substrate 11 formed with the lower electrode layers 12A by vapor deposition, sputtering or the like, for forming the striped bus lines 13 of 0.04 mm in width on the lower electrode layers 12A by wet etching.

Figure 3B:
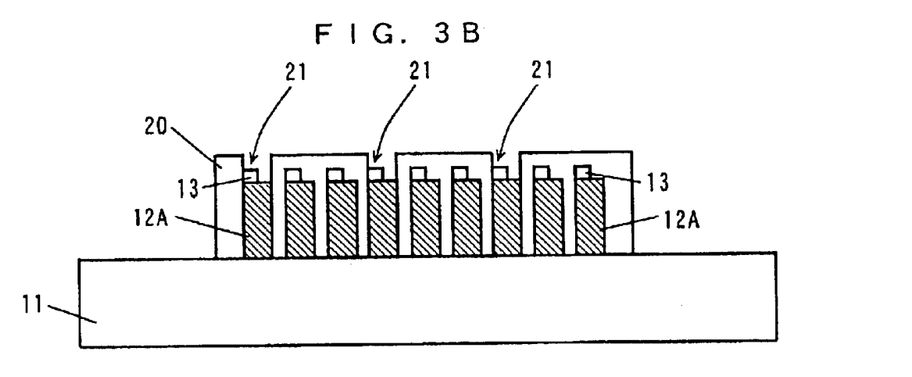

Further, the insulating layer 20 of $SiO_2$ having a thickness of about 1 $\mu$m is formed by sputtering, for entirely covering the lower electrode layers 12A and the bus lines 13. Thereafter openings 21 are formed in prescribed portions of the insulating layer 20 by etching, as shown in FIG. 3B.

Figure 3C:
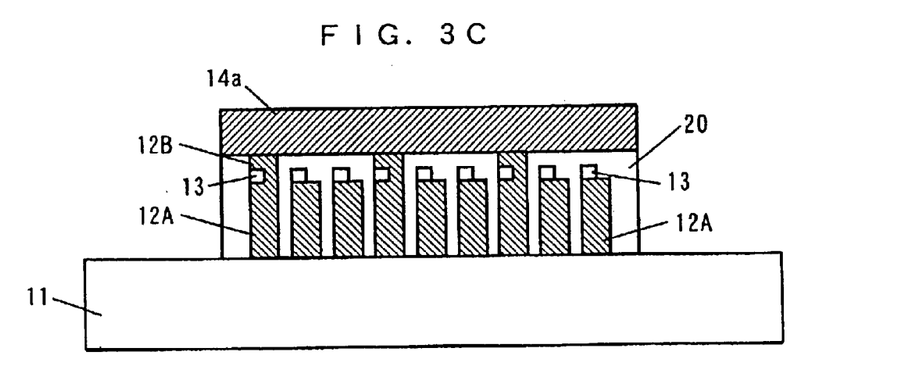

Then, a transparent conductive film of ITO is deposited on the insulating layer 20 by sputtering, thereby forming the upper electrode layers 12B in the openings 21 and forming an upper data electrode 14a of about 30 nm in thickness on the insulating layer 20, as shown in FIG. 3C. The sheet resistance of the upper data electrode 14a is 15 $\Omega/\square$.

Figure 4D:
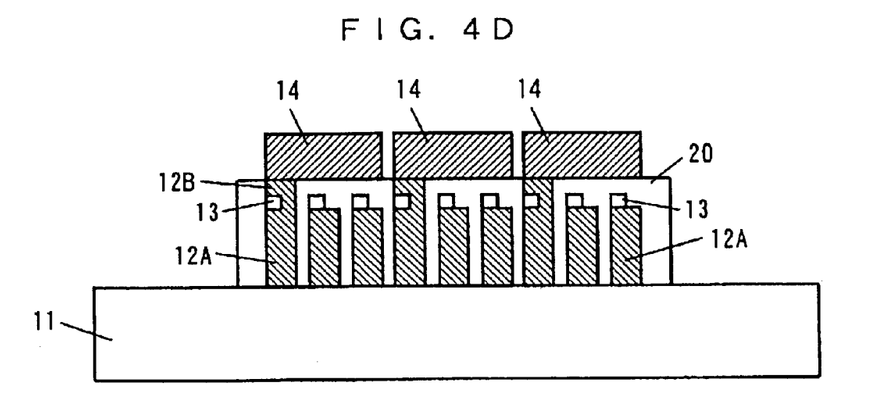
FIGS. 4D and 4E are schematic sectional views showing further steps in the method of manufacturing the organic light emitting device shown in FIGS. 1 and 2A to 2C.

Then, the plurality of upper data electrodes 14 are formed by photolithography and wet etching, as shown in FIG. 4D. The wiring pitch for the upper data electrodes 14 is 0.2 mm. Then, the horizontally extending barrier layers 30 of photosensitive resist are formed on the upper data electrodes 14 at prescribed intervals (see FIG. 1).

Figure 4E:
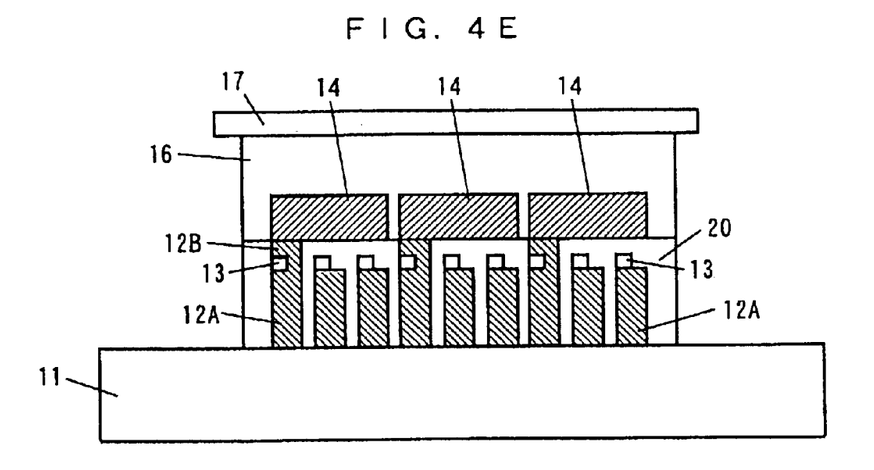

Then, a chamber of a vacuum deposition apparatus is decompressed to a degree of vacuum of not more than $2 \times 10^{-6}$ Torr, for forming the hole transport layer of TPD having a thickness of 50 nm on the overall surface of the pixel region by vacuum deposition, as shown in FIG. 4E. The deposition rate is set to 0.05 nm to 2 nm/sec., and the substrate temperature is controlled to not more than 100° C. Then, the organic emission layer of 30 nm in thickness is formed on the hole transport layer by vacuum deposition. The material for the organic emission layer is prepared from an aluminum qninoline complex doped with quinacridon (doping concentration: 5 wt. %) serving as a dopant. Thus, the organic thin film 16 is formed.

Then, a mask having windows of 0.1 mm in width is employed for forming the plurality of scan electrodes 17 of an Mg—In alloy perpendicularly to the lower data electrodes 12 in the form of stripes by vapor deposition. Thus, the organic light emitting device formed by the plurality of organic EL elements is manufactured.

According to the inventive method, $SiO_2$ is employed as the material for the insulating layer 20, thereby preventing the organic thin film 16 from permeation of moisture from the insulating layer 20.

The material for the insulating layer 20 may alternatively be prepared from photosensitive insulating resin such as photoresist. In this case, an insulating layer 20 of positive photosensitive insulating resin having a thickness of about 1 μm is formed by spin coating for entirely covering the lower electrode layers 12A and the bus lines 13 in the step shown in FIG. 3A. Thereafter the insulating layer 20 is irradiated with light through a mask having openings in prescribed portions, and thereafter developed. Thus, the openings 21 are formed in the prescribed portions of the insulating layer 20, as shown in FIG. 3B.

In the organic light emitting device shown in FIGS. 1 and 2A to 2C, the number of the scan electrodes 17 is reduced to ⅓ and the number of the lower data electrodes 12 is increased to three times as compared with those in the conventional organic light emitting device shown in FIGS. 7 and 8, in order to implement the same number of pixels. Assuming that the number of vertical pixels is 300 and the number of horizontal pixels is 200, for example, the number of the scan electrodes 17 is 100, and the number of the lower data electrodes 12 is 600. In this case, the pixel pitch is 200 μm, and the interval between the pixels is 40 μm.

Figure 5:
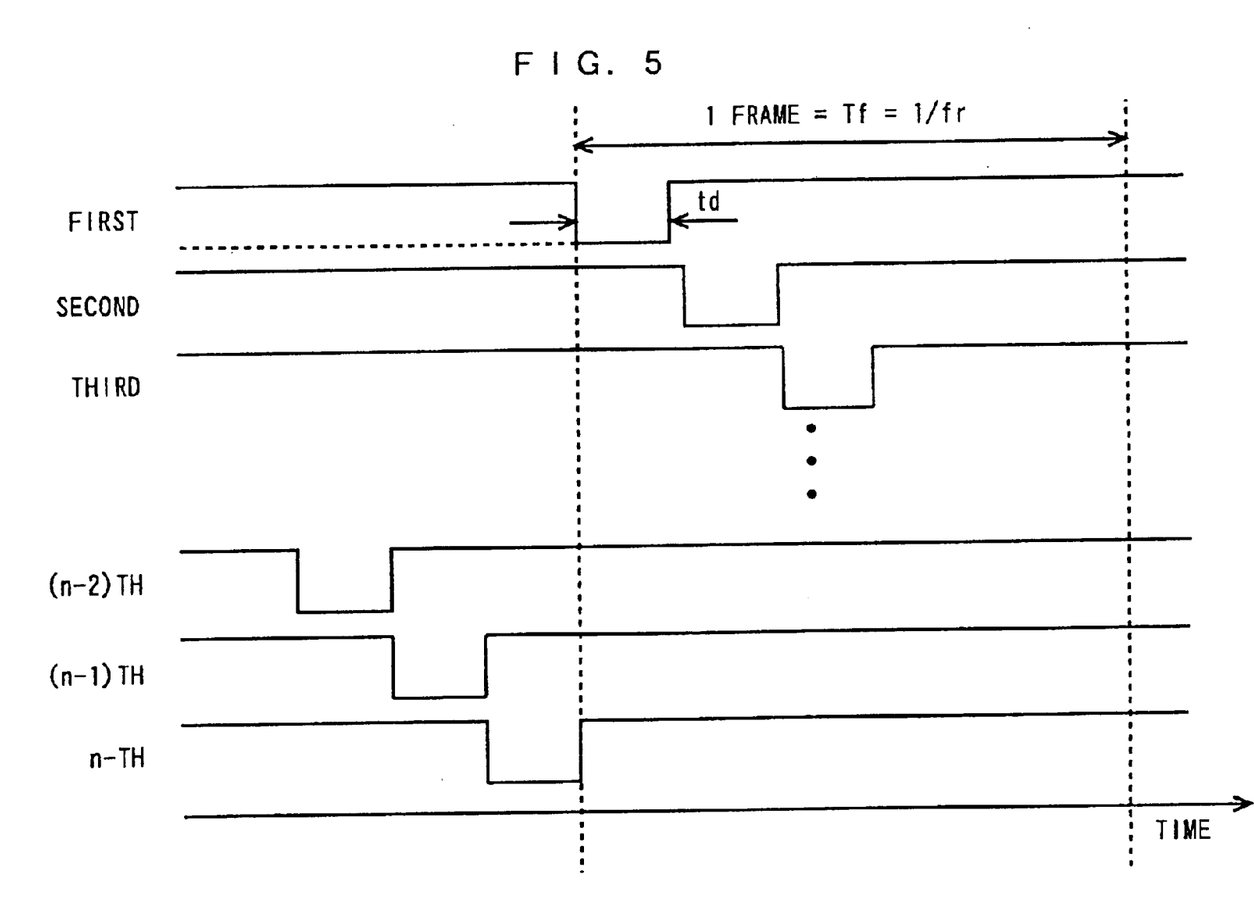
FIG. 5 is a timing chart showing an exemplary method of driving the organic light emitting device according to the embodiment.
Figure 6:
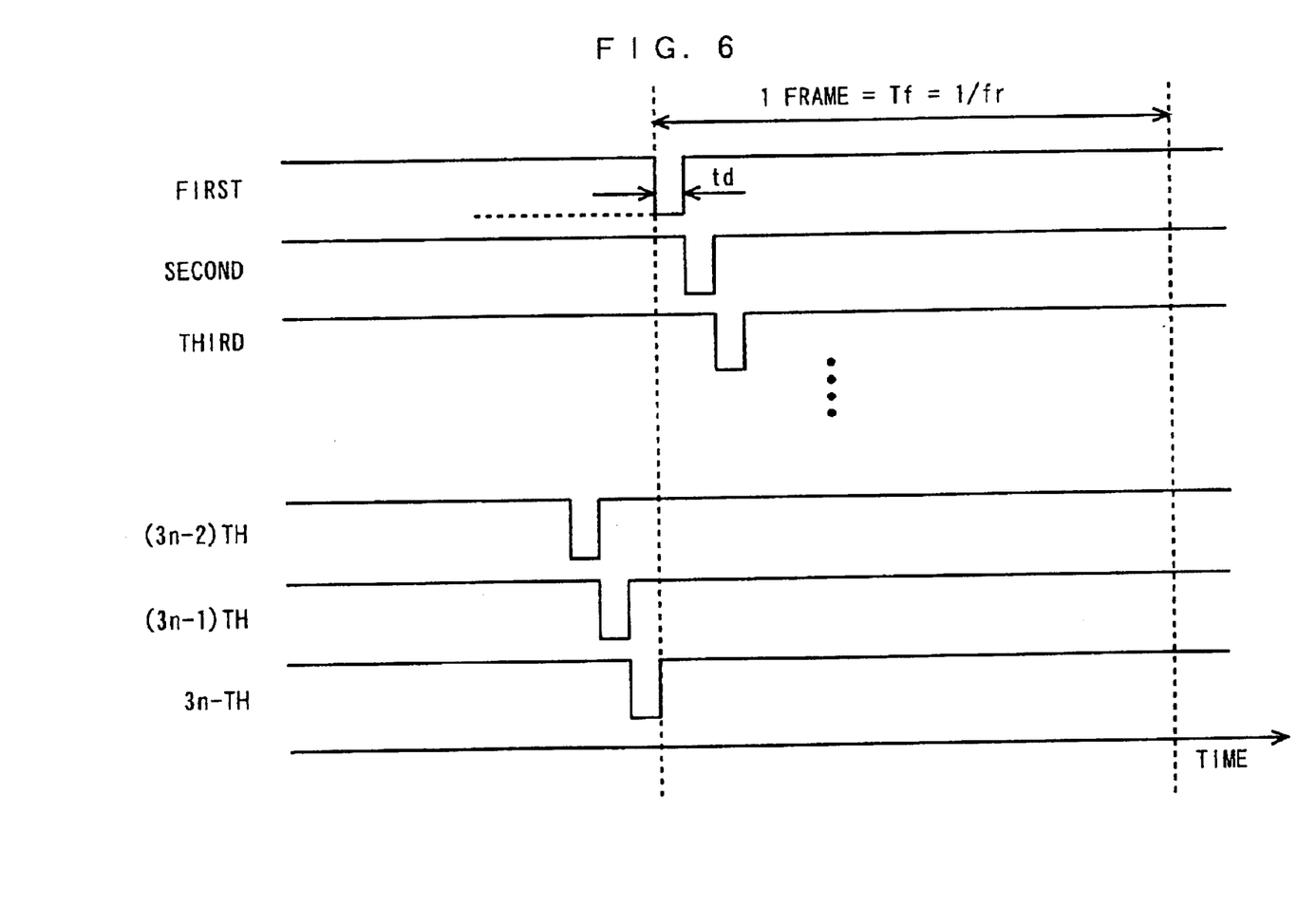
FIG. 6 is a timing chart showing an exemplary method of driving a comparative organic light emitting device.

FIG. 5 is a timing chart showing an exemplary method of driving the organic light emitting device according to the embodiment, and FIG. 6 is a timing chart showing an exemplary method of driving a comparative organic light emitting device. The comparative organic light emitting device has the structure shown in FIGS. 7 and 8.

It is assumed that the organic light emitting device according to the embodiment has n scan electrodes 17, and the comparative organic light emitting device has 3n scan electrodes 7, where n represents an arbitrary integer of at least 2.

In the organic light emitting device according to the embodiment, horizontal pixels of three rows are simultaneously selected by a voltage applied to each scan electrode 17, and each pixel enters a luminous state or a non-luminous state in response to a voltage applied to the lower data electrode 12.

In the comparative organic light emitting device, horizontal pixels of one row are simultaneously selected by a voltage applied to each scan electrode 7, and each pixel enters a luminous state or a non-luminous state in response to a voltage applied to a data electrode 2.

In each of the waveforms shown in FIGS. 5 and 6, a low level shows a period when the pixels corresponding to each scan electrode 17 or 7 are selected, and a high level shows a period when the pixels are not selected.

In the organic light emitting device according to the embodiment, the pixels corresponding to the first scan electrode 17 up to those corresponding to the n-th scan electrode 17 are successively selected in one frame, as shown in FIG. 5.

In the comparative organic light emitting device, the pixels corresponding to the first scan electrode 7 up to those corresponding to the 3n-th scan electrode 7 are successively selected in one frame, as shown in FIG. 6.

Assuming that td represents the time when the pixels are selected by each scan electrode 17 or 7, Tf represents one frame and fr represents the inverse number of one frame Tf, a duty ratio D is expressed as follows:

$$D = td \cdot fr = td / Tf \quad (1)$$

The duty ratio D indicates the ratio of the time when each pixel is selected in one frame. In the organic light emitting device according to the embodiment having n scan electrodes 17, the time td when pixels are selected is Tf/n. In the comparative organic light emitting device having 3n scan electrodes 7, the time td when the pixels are selected is Tf/3n. In the organic light emitting device according to the embodiment, therefore, the duty ratio D is increased to three times that of the comparative organic light emitting device.

Assuming that Lp represents luminance of each pixel selected by the scan electrode 17 or 7, luminance Lav visually recognized by human eyes is expressed as follows:

$$Lav = Lp \cdot D \quad (2)$$

In the organic light emitting device according to the embodiment, the duty ratio D is increased to three times that of the comparative organic light emitting device, whereby the luminance Lav visually recognized by human eyes is also increased to three times according to the above equation (2). In the organic light emitting device according to the embodiment, therefore, the luminance Lp of each selected pixel can be reduced to ⅓ that of the comparative organic light emitting device, in order to implement the same luminance.

Therefore, current density of each pixel can be reduced to ⅓ that of the comparative organic light emitting device and applied voltages can also be reduced in the organic light emitting device according to the embodiment. Consequently, the organic material is prevented from deterioration, occurrence of pixel defects can be suppressed and the luminance can be inhibited from reduction over time, thereby improving reliability of the organic light emitting device.

When the same current density is supplied to each pixel, the luminance Lav visually recognized by human eyes is increased to three times in the organic light emitting device according to the embodiment as compared with the comparative organic light emitting device.

In the organic light emitting device according to the embodiment, as hereinabove described, the number of the scan electrodes 17 can be reduced, whereby the number of the barrier layers 30 provided between the scan electrodes 17 is also reduced, to increase the aperture ratio of the pixels. Thus, the organic light emitting device can be improved in definition and increased size without increasing the luminance of each pixel.

Further, the number of the barrier layers 30 between the scan electrodes 17 can be reduced, whereby permeation of moisture from the barrier layers 30 into the organic thin film 16 is so reduced that progress of deterioration of the pixels is suppressed and patterning of the barrier layers 30 is simplified, thereby improving the non-defective ratio of the organic light emitting device.

In addition, the plurality of lower data electrodes 12 are covered with the insulating layer 20, whereby electrical shorting hardly takes place across the lower data electrodes 12 and the scan electrodes 17 arranged to intersect with each other. Therefore, the organic light emitting device is improved in reliability.

The material for the insulating layer 20 is not restricted to $SiO_2$ or photosensitive insulating resin but may be prepared from another insulating material so far as the insulating material is not etched along with the upper data electrodes 14 formed by transparent conductive films of ITO or the like. For example, a metal oxide, a metal nitride, a carbide, a sulfide or a polymer film can be employed as the material for the insulating layer 20.

The metal oxide can be prepared from MgO, GeO, $Al_2O_3$, NiO, CaO, BaO, $Fe_2O_3$, $Y_2O_3$ or the like, for example. The metal nitride can be prepared from AlN, BN, $Si_3N_4$, $Li_3N$ or the like, for example. The carbide can be prepared from SiC, TiC or the like, for example. The sulfide can be prepared from SrS, EuS, CuS, ZnS or the like, for example. The polymer film can be prepared from polyimide-based macromolecules, for example. The polymer film contains a large amount of moisture, and hence an inorganic material such as a metal oxide, a metal nitride, a carbide or a sulfide is preferably employed.

The insulating layer 20 can be formed by spin coating, CVD (chemical vapor deposition), sputtering, dip printing, vapor deposition or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an organic light emitting device, comprising steps of:

forming a plurality of first electrode layers on a substrate along a first direction;

forming an insulating layer to cover upper portions of said plurality of first electrode layers and clearances between said plurality of first electrode layers;

forming a plurality of openings in said insulating layer located on said plurality of first electrode layers;

forming a plurality of second electrode layers on said insulating layer in the form of a matrix to be electrically connected to said plurality of first electrode layers through said plurality of openings;

forming an organic thin film including an emission layer on said plurality of second electrode layers; and forming a plurality of third electrode layers on said organic thin film along a second direction intersecting with said first direction, wherein said step of forming a plurality of second electrode layers includes a step of dividing said plurality of first electrode layers into units each including m adjacent first electrode layers, m being at least two, dividing a plurality of second electrode layers located above m first electrode layers of each unit into units each including m second electrode layers arranged to deviate in said first direction and adjacent to each other, and connecting to m second electrode layers of each unit to the m first electrode layers of the corresponding unit through said openings of said insulating layer respectively, and said step of forming a plurality of third electrode layers includes a step of forming each third electrode layer in a width covering a portion above the m second electrode layers of each unit in said first direction.

2. The method of manufacturing an organic light emitting device according to claim 1, wherein each of said plurality of second electrode layers has a larger area than said openings provided in said insulating layer.

3. The method of manufacturing an organic light emitting device according to claim 1, wherein each of m second electrode layers of each unit has a length covering a portion above m first electrode layers of corresponding unit in said second direction.

4. The method of manufacturing an organic light emitting device according to claim 1, wherein said insulating layer is made of an oxide, a nitride, a carbide, a sulfide or a polymer film.

5. The method of manufacturing an organic light emitting device according to claim 1, further comprising a step of forming a plurality of bus lines on said plurality of first electrode layers respectively.

6. A method of manufacturing an organic light emitting device, comprising steps of:

forming a plurality of first electrode layers on a substrate along a first direction;

forming an insulating layer to cover upper portions of said plurality of first electrode layers and clearances between said plurality of first electrode layers;

forming a plurality of openings in said insulating layer located on said plurality of first electrode layers;

forming a plurality of second electrode layers on said insulating layer in the form of a matrix to be electrically connected to said plurality of first electrode layers through said plurality of openings;

forming an organic thin film including an emission layer on said plurality of second electrode layers; and forming a plurality of third electrode layers on said organic thin film along a second direction intersecting with said first direction.

7. The method of manufacturing an organic light emitting device according to claim 6, wherein each of said plurality of second electrode layers has a larger area than said openings provided in said insulating layer.

8. The method of manufacturing an organic light emitting device according to claim 6, wherein said insulating layer is made of an oxide, a nitride, a carbide, a sulfide or a polymer film.

9. The method of manufacturing an organic light emitting device according to claim 6, further comprising a step of forming a plurality of bus lines on said plurality of first electrode layers respectively.

* * * * *